United States Patent [19]

Grinberg

[11] Patent Number: 5,045,501
[45] Date of Patent: Sep. 3, 1991

[54] METHOD OF FORMING AN INTEGRATED CIRCUIT STRUCTURE WITH MULTIPLE COMMON PLANES

[75] Inventor: Jan Grinberg, Los Angeles, Calif.

[73] Assignee: Hughes Aircraft Company, Los Angeles, Calif.

[21] Appl. No.: 338,480

[22] Filed: Aug. 15, 1988

Related U.S. Application Data

[63] Continuation of Ser. No. 900,194, Aug. 25, 1986, abandoned.

[51] Int. Cl.⁵ .................. H01L 21/44; H01L 21/48; H01L 21/60
[52] U.S. Cl. ......................... 437/180; 437/190; 437/173; 437/907; 437/908; 148/DIG. 91; 148/DIG. 92; 148/DIG. 93
[58] Field of Search .......... 148/DIG. 150, DIG. 152, 148/DIG. 91, DIG. 93, DIG. 164, 33; 437/173, 907, 908, 915, 180, 190; 357/4, 23.7; 365/72

[56] References Cited

U.S. PATENT DOCUMENTS

| | | | |
|---|---|---|---|
| 4,424,579 | 1/1984 | Roesmer | 357/23.7 |
| 4,472,729 | 9/1984 | Shibata et al. | 357/4 |
| 4,487,635 | 12/1984 | Kugimiya et al. | 357/23.7 |
| 4,536,785 | 8/1985 | Gibbons | 357/4 |
| 4,569,700 | 2/1986 | Toyama | 29/576 J |
| 4,596,604 | 6/1986 | Akiyama et al. | 437/173 |
| 4,604,159 | 8/1986 | Kobayashi et al. | 148/DIG. 152 |
| 4,920,072 | 4/1990 | Keller et al. | 437/190 |
| 4,975,386 | 12/1990 | Rao | 437/190 |
| 4,977,105 | 12/1990 | Okamoto et al. | 437/190 |

FOREIGN PATENT DOCUMENTS

| | | | |
|---|---|---|---|
| 0217965 | 1/1985 | Fed. Rep. of Germany | 148/DIG. 152 |
| 0055075 | 5/1981 | Japan | 357/23.7 |
| 0035969 | 3/1983 | Japan | 357/23.7 |
| 0175853 | 10/1983 | Japan | 357/23.7 |

*Primary Examiner*—Olik Chaudhuri
*Assistant Examiner*—M. Wilczewski
*Attorney, Agent, or Firm*—Paul M. Coble; W. K. Denson-Low

[57] ABSTRACT

An integrated circuit structure and method of forming the same is described in which a plurality of common signal planes are provided for an integrated circuit formed on a layer of semiconductive material (30). The common planes consist of a single crystal semiconductive substrate (2) and at least one conductive layer (26, 66) between the substrate (2) and the semiconductive circuit layer (30), with insulative layers (24, 28, 68) separating the conductive layers (26, 66) from each other and from the substrate (2) and semiconductive layer (30). When one conductive layer (26) is used, a power supply signal (V+) is preferably applied to the substrate (2) and a ground reference to the conductive layer (26). Contacts are made between the integrated circuit and the desired common planes by metallized contacts (56, 60) formed in openings (54, 58) through the underlying material. Various circuit signals can also be introduced through additional conductive layers. In either case, only the top layer of semiconductive material (30) needs to be recrystallized from the substrate (2) into single crystal form, even if the conductive layers (26, 66) are provided as heavily doped semiconductive materials. The novel structure greatly reduces the surface area devoted to metallization, and practically eliminates cross-talk between components. It also enables a reduction of metallization levels from two to one, significantly increasing circuit yield.

6 Claims, 3 Drawing Sheets

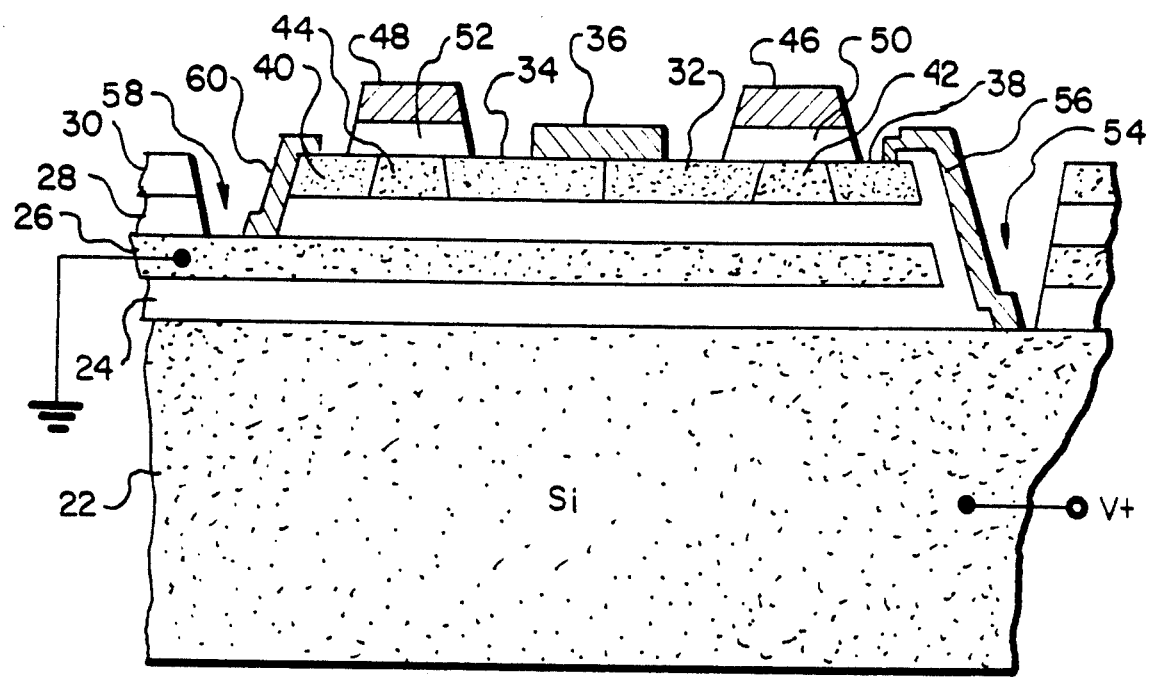
Fig.3.a.
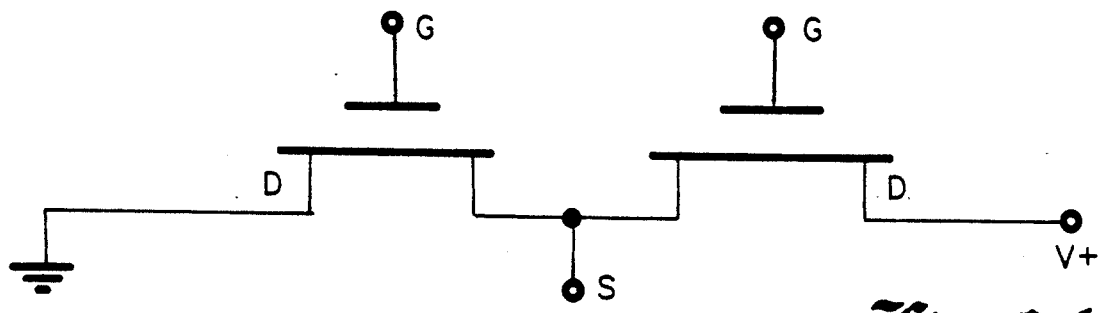
Fig.3.b.
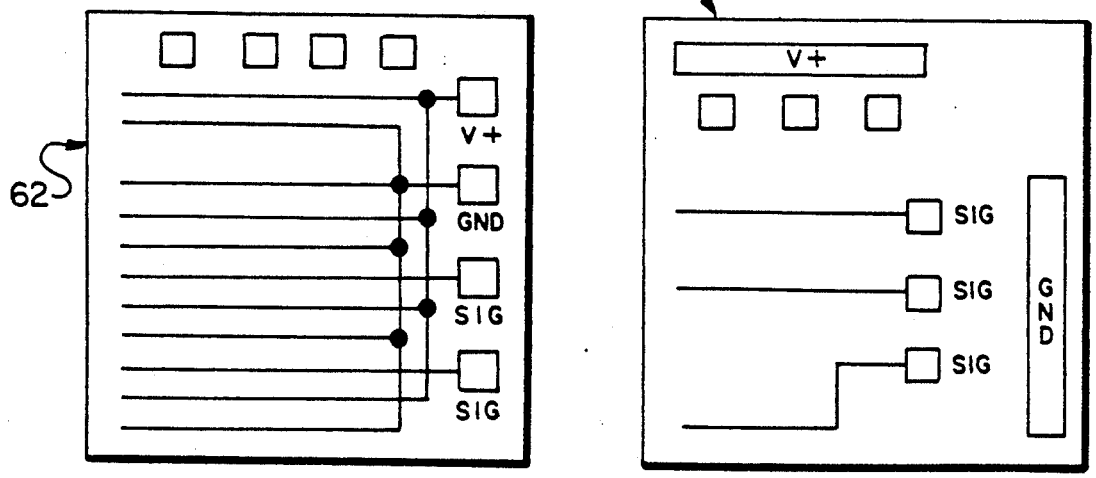
Fig.4.     Fig.5.

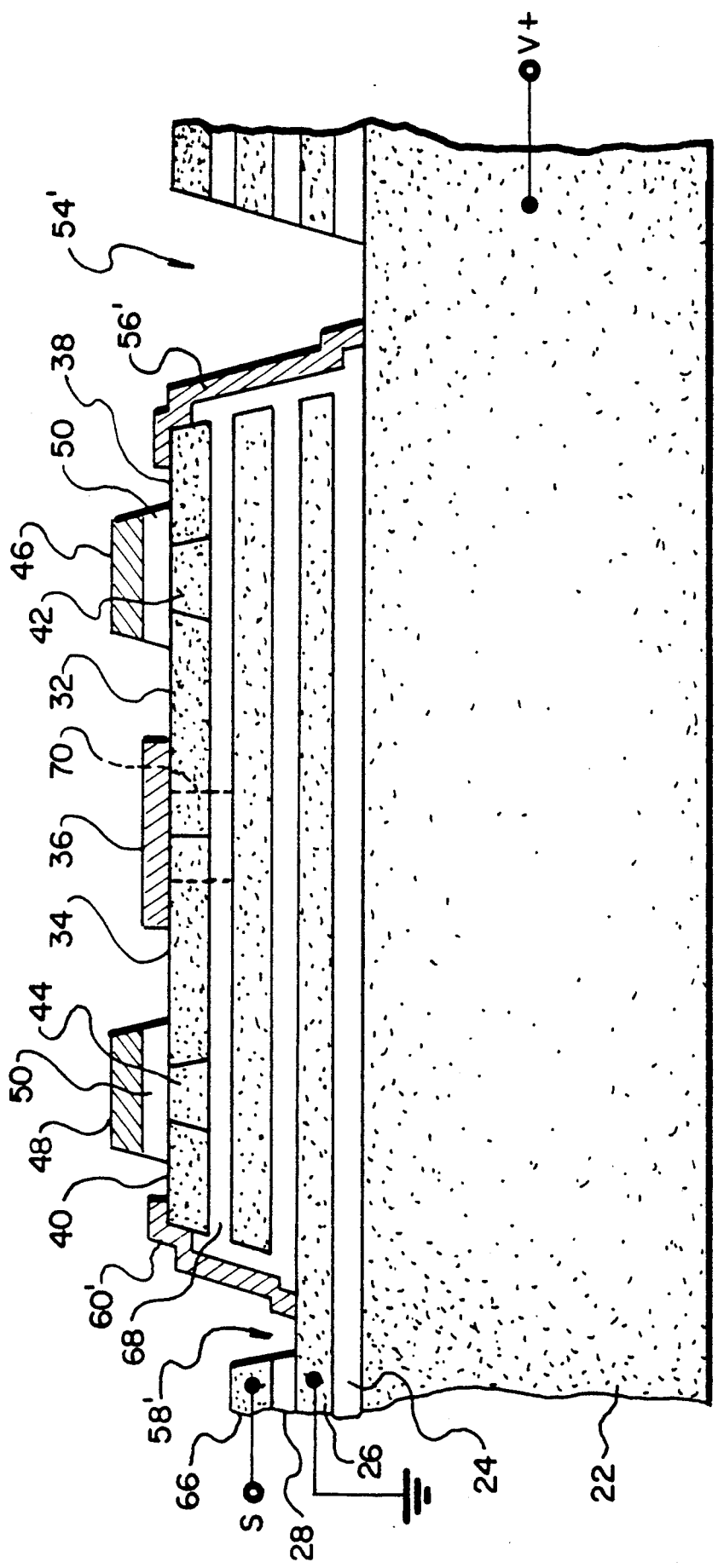

METHOD OF FORMING AN INTEGRATED CIRCUIT STRUCTURE WITH MULTIPLE COMMON PLANES

This application is a continuation of application Ser. No. 900,194 filed Aug. 25, 1986, now abandoned.

BACKGROUND OF THE INVENTION

1. Field of the Invention

This invention relates to integrated circuit structures, and more particularly to multi-layer integrated circuit structures and methods of forming the same.

2. Description of the Prior Art

In conventional integrated circuit structures, it is necessary to bring a ground wire and a power supply wire to practically every, or every other, transistor in the circuit. The required metallization uses up a large amount of area ("real estate") on the chip, and is also a possible source of cross-talk between different circuits. With high density chips metallization typically occupies 80–90% of the chip's surface area, with power supply and ground wires accounting for a significant portion. In fact, there is a trade-off between real estate and cross-talk; heavier metallizations cause less cross-talk, but take up more real estate. Also, the requirement for ground and power supply wires results in the use of two metallization levels to avoid direct crossovers, with an insulator between each layer. In addition to complicating the fabrication process, the two metallizations can still have a tendency to short through the insulator and can significantly decrease circuit yield.

Silicon-on-insulator (SOI) devices have recently been formed in which a so-called ground plane provides a common source of ground reference throughout the circuit, without the need for separate ground wires. The SOI technique is described in a paper by B. Y. Tsaur, J. C. Fan, M. W. Geis, D. J. Silversmith and R. W. Mountain, "Improved Techniques for Growth of Large-Area Single-Crystal Si Sheets Over SiO$_2$ Using Lateral Epitaxy by Seeded Solidification," *Applied Physics Letters*, Vol. 39, Pg. 561–563 (1981). The SOI structure is illustrated in FIG. 1. A bulk silicon substrate 2 is covered with a layer of SiO$_2$ 4, which in turn is covered with a layer of silicon 6 upon which an integrated circuit is fabricated. In FIG. 1, a field effect transistor (FET) is illustrated, with the silicon layer 6 providing a drain 8, source 10 and gate 12 with appropriate doping. An SiO$_2$ portion 14 is formed over the gate and surmounted by a gate contact 16. The underlying silicon substrate 2 is grounded, and a feed-through connection is provided between the substrate and silicon circuit layer wherever ground potential is desired. In the example shown, the source 10 is grounded by means of a metallized contact 18 which has been flowed through an opening 20 in the silicon and SiO$_2$ layers 6, 4 between the drain and substrate 2. Similar ground connects are made to the substrate wherever desired.

The SOI device is formed by providing a layer of amorphous silicon over a single crystal silicon substrate, and separated therefrom by an SiO$_2$ layer except at one end. The amorphous silicon layer is heated from one end to the other by means of a strip heater, causing the substrate to seed the amorphous layer under the heater so as to recrystallize the amorphous layer into a single crystal. The purpose of the SOI device was to improve the insulation between circuit elements by eliminating the ground wires, and thereby reduce stray capacitance and power consumption while increasing the operating frequency range. The structure was also devised to increase radiation hardness where required.

While an improvement, the SOI structure still devotes a significant amount of real estate to metallization, and is still subject to cross-talk between different components. Also, it still requires two metallization layers. Thus, there is still a need for an integrated circuit structure that solves these problems.

SUMMARY OF THE INVENTION

In view of the above problems in the prior art, the object of the present invention is the provision of a novel and improved integrated circuit structure which greatly reduces both the amount of real estate devoted to metallization and the possibility of cross-talk, and requires only a single metallization layer.

This object is accomplished in one embodiment of the invention by providing a common voltage supply plane as well as a common ground plane. Specifically, a first layer of insulative material is formed over a semiconductor substrate, followed in succession by a layer of conductive material, a second layer of insulative material, and a layer of semiconductive material upon which an integrated circuit is fabricated. Ground and power supply connections are made to respective ones of the substrate and conductive layer, preferably with the power supply going to the substrate and ground to the conductive layer. The substrate and conductive layer are then connected through openings in the overlying material to locations on the integrated circuit which require a ground or power supply connection, as the case may be. The conductive layer may comprise either a metal or a heavily doped semiconductor, while the semiconductive and the conductive layers are preferably formed from silicon and the insulative layers from SiO$_2$.

In a generalized form of the invention, at least one additional common plane is provided to make a signal connection with the integrated circuit. The common signal planes are implemented as separate layers of conductive material separated from the underlying structure by insulative layers, with a semiconductive layer bearing an integrated circuit again surmounting the device. Connections are made between the integrated circuit and the signal planes in a manner similar to the connections with the ground and power supply planes.

The structure in either case is formed by first providing all of the layers on the substrate, and then recrystallizing the top semiconductive layer prior to forming the integrated circuit in a single recrystallization heat step, without a separate recrystallization of any of the other layers.

A very significant reduction of metallization is achieved which substantially increases the real estate available on the chip for useful circuit structure. The closely spaced ground and power supply planes practically eliminate cross-talk between components. On many chips, the elimination of ground and power supply wires will also enable a reduction of metallization levels from two to one, thereby significantly increasing circuit yield.

These and other features and advantages of the invention will be apparent to those skilled in the art from the following detailed description of preferred embodiments, taken together with the accompanying drawings in which:

BRIEF DESCRIPTION OF THE DRAWINGS

FIG. 3a is a sectional view of the structure from FIG. 2 with an integrated circuit fabricated thereon;

FIG. 3b is a symbolic representation of the circuitry formed on the structure of FIG. 3a;

FIGS. 4 and 5 illustrate the metallization required with conventional chip designs and the present invention, respectively; and FIG. 6 is a sectional view of another embodiment of the invention in which an integrated circuit is shown fabricated on a structure with common ground, power supply and signal planes.

DETAILED DESCRIPTION OF PREFERRED EMBODIMENTS

Figure 1:
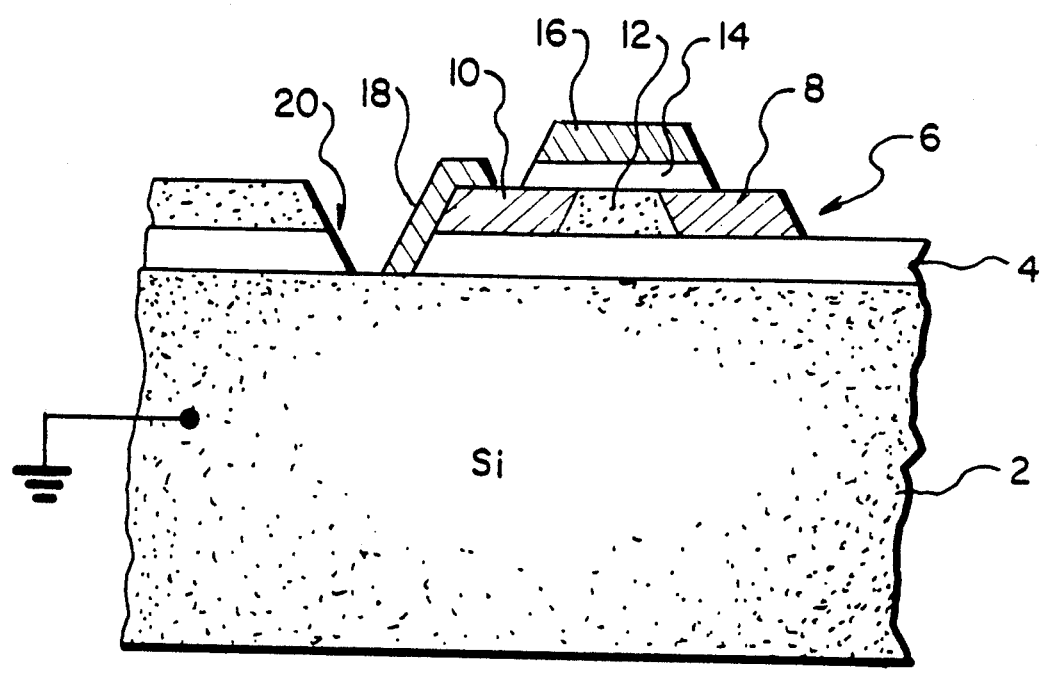
FIG. 1 is a sectional view of a prior art SOI integrated circuit structure.
Figure 2:
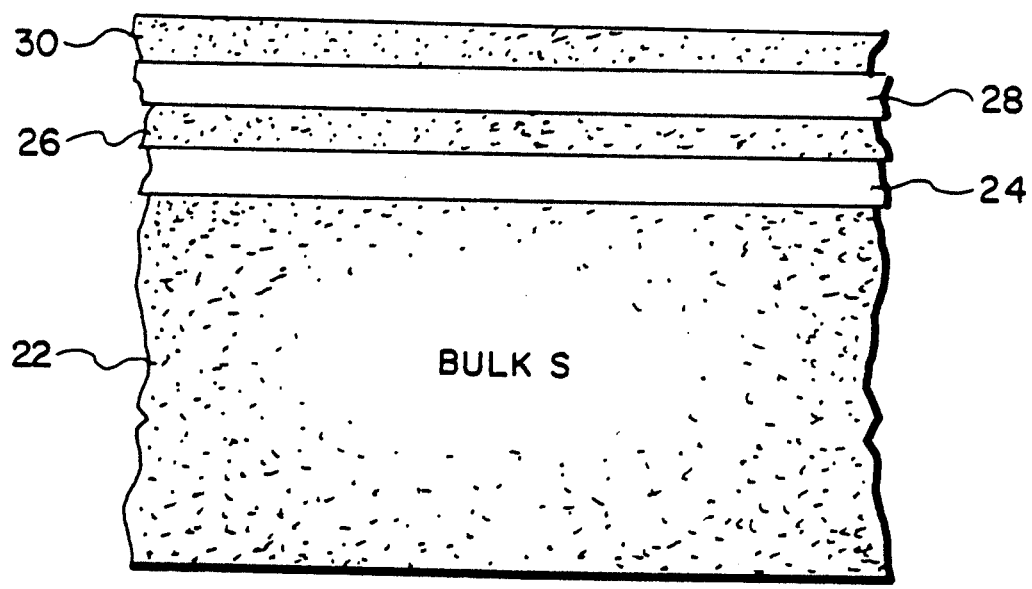
FIG. 2 is a sectional view of a structure having common ground and power supply planes in accordance with the invention.

Referring to FIG. 2, a base structure for an integrated circuit device formed in accordance with the present invention is shown. A bulk single crystal silicon substrate 22 is covered with a layer of insulative material 24, preferably $SiO_2$. This layer in turn is covered with a layer of conductive material 26, and then by another layer of insulating material 28. The structure is surmounted with a layer of semiconductive material 30, preferably silicon, upon which an integrated circuit can be fabricated.

All of the layers are deposited in succession from bottom to top, with the semiconductive material 30 deposited in an amorphous form. One end of the semiconductive material 30 is initially connected (by a connection not shown) to the single crystal substrate 22. The semiconductor layer 30 is converted to a single crystal form, for example, by passing a strip heater over the layer, beginning at the end where it is connected to the substrate. This causes the substrate to progressively seed the semiconductive layer as the strip heater passes over it, causing the layer to recrystallize into a single crystal. While the recrystallization of an amorphous semiconductor from a single crystal semiconductor is a known process, it is a unique feature of the present invention that only one recrystallization step is necessary, even though the conductive layer 26 is also preferably formed from a heavily doped semiconductor material such as silicon. The fabrication of the structure is thus almost as simple as the fabrication of an SOI circuit structure.

Various materials can be used for the different elements of the structure. The substrate 22, conductive layer 26 and semiconductor layer 30 can be formed from semiconductive materials such as silicon or germanium, with each element doped to an appropriate level. Semiconductive compounds such as GaAs or InPh might also be used, although evaporation of the constituents during recrystallization could be a problem. The substrate should be conductive enough to serve as a common potential plane, although only a relatively light doping is required for this purpose because of the substrate's thickness. The conductive layer 26 can also be formed from a refractory material such as tungsten or molybdenum, so long as the metal is capable of withstanding the heat of recrystallization. The insulative layers could also be formed from silicon nitride or other suitable insulator.

In the preferred embodiment, the substrate 22 provides a common plane for the power supply voltage while the conductive layer 26 provides a common plane for a ground reference. Although the functions of the substrate and conductive layer could be reversed, doing so could create conductive back channels at the interface of the top semiconductive layer 30 and its underlying $SiO_2$ layer 28. Since only the top semiconductive layer which bears the integrated circuit must be of very high quality, when the conductive layer 26 is provided as a heavily doped semiconductor it is not necessary that it be recrystallized. This permits the base structure to be formed with only one recrystallization step.

The various layers should be fairly thin to avoid step coverage problems, preferably on the order of one micron, or less for finer lithography. If radiation hardness is desired, layers in the order of 0.2 microns thick are preferred, since thinner materials absorb less radiation.

Referring now to FIG. 3a, an integrated circuit is shown fabricated on the base structure of FIG. 2. The circuit consists of a dual FET with sources 32, 34, a common source connection 36, drains 38, 40, gates 42, 44, gate contacts 46, 48 and gate contact insulating layers 50, 52.

The substrate 22 is connected to a power supply source, and provides a common power supply plane wherever needed on the surface. The conductive layer 26 is connected to ground and provides a ground reference wherever needed on the integrated circuit. In the circuit illustrated in FIG. 3a, the righthand drain 38 is connected to the power supply V−, while the lefthand drain 40 is grounded. The connection for drain 38 is accomplished by forming an opening 54 adjacent the drain through all of the underlying layers to substrate 22, and flowing a metal contact 56 through the opening to provide an electrical connection between drain 38 and substrate 22. On the lefthand side of the device, an opening 58 is formed through the conductive layer 30 and insulative layer 28 to conductive layer 26, with a metallic connection 60 provided through the opening between the drain 40 and conductive layer 26. The two FETs are shown symbolically in FIG. 3b, with their symbolic representations in approximate vertical alignment below the corresponding physical implementations shown in FIG. 3a.

A comparison of the metallization required with conventional integrated circuit structures and the present invention is illustrated in FIGS. 4 and 5. In FIG. 4, an integrated circuit chip 62 has contact pads for power supply, ground and signal connections, with an extensive network of wires required to bring each to the appropriate circuit elements. The unmarked pads can be used for various inputs or outputs, such as additional signal, clock, control lines, etc. The wires normally occupy an even greater portion of the chip surface than the simplified metallization illustrated in FIG. 4. In FIG. 5, by contrast, an integrated circuit chip 64 is shown which has been manufactured in accordance with the present invention, and thus eliminates the need for either ground or power supply wire metallizations on the surface of the chip. This yields a significant increase in the real estate available for the circuit elements. Also, because of their lower resistivity, low inductance and the high capacitance between planes, the closely spaced ground and power supply planes practically eliminate cross-talk between components. Since the common power supply and ground planes inherently avoid crossover contacts, only one metallization layer is generally required. This is a significant improvement over conventional and SOI fabrication methods, in which two metallization layers are required, and results in a higher circuit yield.

A generalization of the invention is illustrated in FIG. 6, in which the surface wire metallizations associated with one of the signal terminals have been replaced with another common plane devoted to that signal. The structure of FIG. 6 is somewhat similar to that of FIG. 3a, and common elements are denoted by common reference numerals. In FIG. 6, however, a second conductive layer 66 similar to conductive layer 26 has been added. New layer 66 is separated from conductive layer 26 by insulative layer 28, and from semiconductor layer 30 by a new insulative layer 68. The substrate 22 and conductive layer 26 are connected respectively to a power supply and ground, as previously. The new conductive layer 66 is connected to a signal terminal (for instance, a clock signal), and provides that signal to wherever needed on the circuit. For example, if conductive layer 66 provides a common plane for the FET source signal, a metallized connection 70 (shown in dash lines) is made through a corresponding opening in semiconductive layer 30 and insulative layer 68 between source contact 36 and source signal plane 66. Connections between the FET drains and the voltage source and ground planes are made as in FIG. 3a, but openings 54', 58' and metal contacts 56', 60' have been extended to accommodate the new conductive and insulative layers 66, 68. Contacts 56', 60' are separated from the intermediate semiconductive layers by an oxide to avoid shorting to ground plane 26.

The circuit structure of FIG. 6 shows a common plane for only one signal input. Additional common planes could also be provided in a similar manner for other signal inputs. However, with each additional common plane, the requirements for the openings which connect between the circuits and the underlying planes becomes more complicated, and may impose a practical limitation on the total number of permissible common planes. In any event, only the uppermost semiconductive layer 30 needs to be recrystallized from the substrate 22, requiring the performance of only one recrystallization step regardless of how many common planes are provided.

Several embodiments of the invention have thus been shown and described. As numerous variations and alternate embodiments will occur to those skilled in the art, it is intended that the invention be limited only in terms of the appended claims.

I claim:

1. A method of forming an integrated circuit structure, comprising:
    providing a passive semiconductor substrate,
    doping said substrate so that it is sufficiently conductive to serve as a common potential plane,
    forming a plurality of layers over said semiconductor substrate, the layers comprising in succession a first layer of insulative material, a layer of conductive material, a second layer of insulative material and a top layer of semiconductor material,
    forming a substantially two-dimensional integrated circuit only on the top layer of semiconductor material and not on said substrate or other layers, said first insulative layer being formed directly on said substrate,
    providing connections from the substrate and conductive layer through the intervening insulative layers substantially directly to desired locations on the integrated circuit, said connections terminating at said locations on the integrated circuit without extending substantially over the surface of said integrated circuit, and
    providing respective signal connections to respective ones of the substrate and conductive layer, the substrate and conductive layer selectively providing respective common planes for a power supply voltage and a ground reference wherever needed on the integrated circuit.

2. The method of claim 1, wherein the layer of semiconductive material bearing the integrated circuit is recrystallized prior to forming the integrated circuit in a single recrystallization heat step without a separate recrystallization of the conductive layer.

3. The method of claim 1, wherein said integrated circuit includes conductive metallization interconnects in a single layer without crossovers.

4. A method of forming an integrated circuit structure, comprising:
    providing a passive semiconductor substrate,
    doping said substrate so that it is sufficiently conductive to serve as a common potential plane,
    forming a plurality of layers over said semiconductor substrate, the layers comprising a plurality of layers of conductive material surmounted by a top layer of semiconductor material and separated from each other and from the substrate and top semiconductor layer by respective insulative layers,
    forming a substantially two-dimensional integrated circuit only on the top layer of semiconductor material and not on said substrate or other layers, one of said insulative layers being formed directly on said substrate,
    providing ground, power supply and signal connections to respective ones of the substrate and conductive layers, the substrate and conductive layers selectively providing respective common planes for a power supply voltage, a ground reference and operating signals wherever needed on the integrated circuit, and
    providing connections from the substrate and conductive layers through the intervening insulative layers substantially directly to desired locations on the integrated circuit, said connections terminating at said locations on the integrated circuit without extending substantially over the surface of said integrated circuit.

5. The method of claim 4, wherein the layer of semiconductive material bearing the integrated circuit is recrystallized prior to forming the integrated circuit in a single recrystallization heat step without a separate recrystallization of the conductive layers.

6. The method of claim 4, wherein said integrated circuit includes conductive metallization interconnects in a single layer without crossovers.

* * * * *